United States Patent [19]
Nishimura et al.

[11] Patent Number: 5,604,380
[45] Date of Patent: Feb. 18, 1997

[54] SEMICONDUCTOR DEVICE HAVING A MULTILAYER INTERCONNECTION STRUCTURE

[75] Inventors: Hiroyuki Nishimura; Hiroshi Adachi; Etsushi Adachi; Shigeyuki Yamamoto; Shintaro Minami; Shigeru Harada; Toru Tajima; Kimio Hagi, all of Hyogo, Japan

[73] Assignee: Mitsubishi Denki Kabushiki Kaisha, Tokyo, Japan

[21] Appl. No.: 401,804

[22] Filed: Mar. 10, 1995

[51] Int. Cl.⁶ .............................. H01L 29/41; H01L 29/51
[52] U.S. Cl. .............. 257/758; 257/759; 257/40; 257/773; 257/791; 257/642
[58] Field of Search .................... 257/40, 758, 759, 257/760, 773, 774, 791, 642, 643

[56] References Cited

U.S. PATENT DOCUMENTS

| | | | |
|---|---|---|---|
| 4,349,609 | 9/1982 | Takeda et al. | 257/759 |
| 4,855,191 | 8/1989 | Arakawa et al. | 428/690 |
| 5,057,336 | 10/1991 | Adachi et al. | 427/44 |
| 5,081,202 | 1/1992 | Adachi et al. | 528/43 |
| 5,180,691 | 1/1993 | Adachi et al. | 437/235 |
| 5,183,846 | 2/1993 | Aiba et al. | 524/865 |
| 5,306,947 | 4/1994 | Adachi et al. | 257/642 |

FOREIGN PATENT DOCUMENTS

| | | |
|---|---|---|
| 0021818 | 1/1981 | European Pat. Off. . |
| 4300355 | 7/1993 | Germany . |
| 4316266 | 12/1993 | Germany . |
| 56-49540 | 5/1981 | Japan . |
| 362554 | 3/1991 | Japan . |
| 0099271 | 4/1995 | Japan . |

*Primary Examiner*—Sara W. Crane
*Assistant Examiner*—David B. Hardy
*Attorney, Agent, or Firm*—Oblon, Spivak, McClelland, Maier & Neustadt, P.C.

[57] ABSTRACT

In a semiconductor device and a method of fabrication thereof, a resin film forms an interlayer film of the semiconductor device having a multilayer interconnection structure, and is formed by only one coating using coating liquid containing silicone ladder polymers represented by the chemical formula: $(HO)_2(R_2Si_2O_3)_nH_2$. As a result, it is possible to improve long-term reliability of electric characteristics or the like, and simplify a process.

8 Claims, 5 Drawing Sheets

SEMICONDUCTOR DEVICE HAVING A MULTILAYER INTERCONNECTION STRUCTURE

BACKGROUND OF THE INVENTION

1. Field of the Invention

The present invention relates to a semiconductor device having a multilayer interconnection structure and a method of fabrication thereof, and more particularly to the semiconductor device having an interlayer insulating film including a silicone ladder series resin film, and the method of fabrication thereof.

2. Description of the Prior Art

Because of higher integrated semiconductor devices such as LSI, their interconnection have been developed to have a multilayer structure as well as a higher density structure. Hence, an upper layer of the multilayer interconnection has a large variation in a step level, a fine wiring pattern formed on the upper layer causes a problem of damaged reliability due to disconnection and so forth.

Therefore, flattening of an interlayer film is an important technique to facilitate the multilayer interconnection, and various methods have been developed as the flattening technique.

Above all, an SOG (spin on glass) coating method is often employed because of an easy process, to coat a surface of a semiconductor substrate having the variation in the step level with liquid insulating material so as to form an interlayer insulating film having a flat surface.

However, in this method, a failure may occur in a wiring made of aluminium (Al) or the like due to, for example, moisture emitted from the material (hereinafter referred to as SOG material) which is used in the SOG coating method. Thus, long-term reliability may be damaged due to degraded electric characteristics and so forth.

In order to avoid the problem, one method is employed in which the interlayer film has a three-layer structure so as not to directly contact the wiring with a coating film (hereinafter referred to as SOG film) formed by the SOG coating method.

For example, as disclosed in Japanese Patent Publication (Kokai) No. 3-62554, an interlayer insulating film having the three-layer structure is formed to have a structure in which the SOG film is interposed between oxide films formed by plasma vapor phase epitaxy.

A brief description will now be given of a method of fabrication of the interlayer insulating film having the three-layer structure.

As shown in FIG. 5(a), a pattern serving as a first Al wiring layer 3 is initially formed on a semiconductor substrate 1 and an insulating film 2.

Subsequently, as shown in FIG. 5(b), a silicon oxide ($SiO_2$) film 4 is deposited by a plasma CVD (chemical vapor deposition) method on the first aluminium (hereinafter abbreviated Al) wiring layer 3. Further, a surface of the silicon oxide film 4 is coated by a spin coater with an SOG film 8.

Thereafter, as shown in FIG. 5(c), a silicon oxide film 6, deposited by the plasma CVD method, is formed on a surface of the SOG film 8.

Next, according to an RIE (reactive ion etching) method, a contact hole is provided by etching in the interlayer insulating film having the three-layer structure at a predetermined position.

As shown in FIG. 5(d), a second Al wiring layer 7 is formed by using, for example, a sputtering method to provide patterning for a desired form.

In this case, it is necessary to provide a flat primary coat so as to form the second Al wiring layer 7 with high accuracy.

The SOG film 8 is formed for the flattening to serve as an intermediate layer in the interlayer insulating film having the three-layer structure. When an inorganic SOG material is used to form the thick SOG film 8 by only one coating, there is a problem in that the SOG film 8 is easily cracked due to shrinkage or the like at a time of thermosetting.

Hence, the thermostting must be performed after applying the inorganic SOG material so as to form a thin film. Further, in order to improve flatness, it is necessary to repeat the coating of the thin SOG film several times so as to form the multilayered SOG film 8.

However, the process inevitably results in the increased number of steps for the flattening. In addition, it is naturally difficult to form a thick film made of the inorganic SOG material by only one coating.

As compared with the above, when organic SOG materials such as silicone resin are employed, a thick film can be easily formed by only one coating, and even a thick film by one coating can offer the advantage of good resistance to crack at the time of thermosetting.

However, though the conventional organic SOG material enables one coating and can provide more improved flatness by the coating than that in the inorganic SOG material as described before, it is impossible to provide sufficient flatness required in the multilayer interconnection structure.

Further, the conventional organic SOG material discharges substantially the same amount of gases such as moisture in the film as that in the inorganic SOG material. When the organic SOG film is employed as a single layer film, the gases such as moisture adversely affect upper and lower semiconductor layers or a metallic layer in the SOG film.

Therefore, as set forth above, the organic SOG material is employed as an interlayer film which is vertically interposed between the inorganic silicon oxide films to form the three-layer structure.

Even in case of the interlayer insulating film having the three-layer structure, the SOG film serving as the intermediate layer is exposed by providing the through-hole for wiring.

This interferes with the wiring such as Al in the through-hole to generate degraded electric characteristics, resulting in a disadvantage for the long-term reliability.

In order to avoid the disadvantage, etch back is typically carried out to remove the remaining SOG film on a flattened wiring pattern of a lower wiring layer so as to expose no organic SOG film in the through-hole which is provided above the wiring pattern of the lower layer.

From this point of view, if silicone ladder series resins are employed as the organic SOG material, it is possible to obtain a sufficiently thick film by the one coating. It is also possible to reduce the amount of discharged gases such as moisture generated by dehydrating condensation because of a small amount of —OH group.

That is, even when the silicone ladder series resins are exposed in the through-hole, no failure occurs in the Al wiring, thereby eliminating restriction on a structure of a semiconductor device and reducing the number of steps.

This type of silicone ladder series resin is disclosed in, for example, Japanese Patent Publication (Kokai) No. 56-49540.

Though the silicone ladder series resin employed in the publication discharges a small amount of gases, such as moisture, and it can provide excellent reliability of the wiring, the silicone ladder series resin has a poor bond performance between the resin film and adjacent layers consequently, the resin film may be easily separated from a primary coat or an upper film.

Particularly, resins frequently exhibiting the poor bond performance may include resins having a —$CH_3$ group or a —$C_2H_5$ group at an end of a molecular chain at which an —OH group is absent, and resins having a molecular weight exceeding 100,000 and having an extremely small amount of —OH group.

However, resins having —OH groups in side chains of molecular chains discharge a large amount of gases.

Meanwhile, in the process to form the interlayer insulating film having the three-layer structure in the above multilayer interconnection structure, the inorganic silicon oxide film formed by, for example, the plasma CVD method and the organic SOG film are concurrently etched in the etch back or in the process to form the through-hole.

Hence, it is necessary to reduce the difference between etching rates of the organic SOG film and the silicon oxide film. The organic SOG film and the silicon oxide film are formed as adjacent interlayer films, and are finally treated as the same layer.

In the etching process thereof, if two types of layers are concurrently etched and two materials have considerably different etching rates, etched surfaces of the two materials do not conform to each other. As a result, it is impossible to provide a desired processed form.

For example, when the lower layer is flattened by the etch back method, it is necessary to provide the same etching rate in upper and lower layers.

In reality, the etching rate of the organic SOG film is generally slower than that of the inorganic SOG film in dry etching.

This is why the organic SOG film contains carbon. That is, in the dry etching for etching inorganic materials, as the etched material has a larger amount of carbon, the etching rate becomes more slowly.

Here, it is possible to provide a higher etching rate of carbon-containing organic SOG film by using an oxygen-containing etching gas in the dry etching.

As described before, if the same etching rate can be set in the dry etching for the silicon oxide film made of the inorganic material and for the organic SOG film made of organic material, the interlayer films in a two-layer structure can be concurrently etched.

Further, a large amount of oxygen must be added to the etching gas in order to etch resins such as silicone ladder series resins containing a large amount of carbon at the same dry etching rate as that of the silicon oxide film containing no carbon.

However, if a larger amount of oxygen is added, a greater amount of the resist used as a mask is etched to form a pattern, resulting in a low selection ratio of the silicone ladder series resins serving as the etching target and the resists serving as the mask.

Consequently, since patterning such as formation of the through-hole is interfered, an amount of added oxygen should be limited.

SUMMARY OF THE INVENTION

In view of the foregoing, it is an object of the present invention to provide a semiconductor device having a multilayer interconnection structure in which long-reliability of a wiring material, electric characteristics, and so forth can be improved, and to provide a method of fabrication thereof.

It is another object of the present invention to provide a method of fabrication of a semiconductor device in which a process can be simplified.

It is still another object of the present invention to provide a method of fabrication of a semiconductor device in which a contact hole can be successfully provided even when an interlayer insulating layer is formed by a combination of an inorganic silicon oxide film and a flattening film made of a silicone ladder polymer.

It is a further object of the present invention to provide a method of fabrication of a semiconductor device in which etching can be carried out by using a gas containing no oxygen.

It is a still further object of the present invention to provide a method of fabrication of a semiconductor device in which it is possible to provide the same etching selection ratio of a film and other layers, or provide largely different selection ratios of the film and a resist mask used at a time to form a pattern by the etching.

According to the first aspect of the present invention, for achieving the above-mentioned objects, there is provided a semiconductor device in which an interlayer insulating layer includes a flattening film made of silicone ladder series resins, and the flattening film is a cured film made of resin materials containing at least one of silicone ladder polymers which are represented by the chemical formula:

(where n denotes an integer which is sufficient to obtain a weight average molecular weight of the compound in the range of 2,000 to 100,000; and R represents any one of a hydrogen atom, a lower alkyl group, and a phenyl group).

As stated above, in the semiconductor device according to the first aspect of the present invention, the interlayer insulating layer includes the flattening film (i.e., a cured film) made of the silicone ladder series resins. Though the silicone ladder polymer can provide a good bond performance to a primary coat because of "—OH" at its end of a molecular chain, the silicone ladder polymer causes little gas discharge (i.e., little outgassing) adversely affecting other layers since "—OH" is absent in its side chains.

According to the second aspect of the present invention, there is provided a semiconductor device in which the resin material contains hydrogen silsesquioxane.

According to the third aspect of the present invention, there is provided a semiconductor device in which the flattening film contains a silicone polymer containing hydroxy groups in side chains.

According to the fourth aspect of the present invention, there is provided a semiconductor device in which the resin material contains a silane coupling agent in the range of 150 to 100,000 ppm.

As stated above, in the semiconductor device according to the second to fourth aspects of the present invention, the resin material contains hydropen silsesquioxane, the silicone polymer containing the hydroxy groups in the side chains, or the silane coupling agent in the range of 150 to 100,000 ppm. As a result, it is possible to improve a bond performance between the cured film and an upper or lower layer.

According to the fifth aspect of the present invention, there is provided a method of fabrication of a semiconductor device in which a resin material is used containing silicone ladder polymers which are represented by the chemical formula: $(HO)_2(R_2Si_2O_3)_nH_2$, an organic solvent is added to the resin material to prepare and apply a resinous solution having a resin concentration of 5 to 30 wt % so as to form a coating film, and a flattening film is formed by thermo-setting the coating film.

As stated above, in the method of fabrication of the semiconductor device according to the fifth aspect of the present invention, since the resinous solution having the resin concentration of 5 to 30 wt % is used, it is possible to provide a cured film having excellent flatness and a good plugging performance.

According to the sixth aspect of the present invention, there is provided a method of fabrication of a semiconductor device in which the resinous solution contains one silicone ladder polymer having a high molecular weight of 30,000 or more, and the other silicone ladder polymer which has a low molecular weight less than 30,000 and is 20 wt % or more with respect to the one silicone ladder polymer having the high molecular weight.

As stated above, in the method of fabrication of the semiconductor device according to the sixth aspect of the present invention, the resinous solution is employed in which the one silicone ladder polymer having the high molecular weight of 30,000 or more is mixed with the other silicone ladder polymer having the low molecular weight less than 30,000. Consequently, it is possible to enhance a bond performance of the silicone ladder polymer to a primary coat. Further, it is thereby possible to improve flatness and a plugging performance during coating.

According to the seventh aspect of the present invention, there is provided a method of fabrication of a semiconductor device in which a resinous solution contains hydrogen silsesquioxane.

According to the eighth aspect of the present invention, there is provided a method of fabrication of a semiconductor device in which a resinous solution contains a solution in which a silicone polymer containing hydroxy groups in side chains is dissolved with a concentration in the range of 5 to 40 wt %.

As stated above, in the method of fabrication of the semiconductor device according to the seventh and eighth aspects of the present invention, hydrogen silsesquioxane, or the silicone polymer containing hydroxy groups in the side chains is used as the resinous solution. As a result, it is possible to improve a bond performance to a primary coat, flatness and a plugging performance of a cured film.

According to the ninth aspect of the present invention, there is provided a method of fabrication of a semiconductor device in which a resinous solution contains a silane coupling agent in the range of 150 to 100,000 ppm with respect to a resin content.

As stated above, in the method of fabrication of the semiconductor device according to the ninth aspect of the present invention, the resinous solution is used containing the silane coupling agent in the range of 150 to 100,000 ppm, resulting in an improved bond performance to a primary coat.

According to the tenth aspect of the present invention, there is provided a method of fabrication of a semiconductor device in which a carbon content of a resinous solution is controlled to a predetermined value.

As stated above, in the method of fabrication of the semiconductor device according to the tenth aspect of the present invention, the carbon content is controlled to the predetermined value, thereby enabling control of an etching rate. When an interlayer insulating layer includes an inorganic silicon oxide film and a flattening film made of silicone series resin, the same etching rate can be provided for the two films. The etching rate can be held even in case of an etching gas containing a small amount of oxygen or no oxygen.

According to the eleventh aspect of the present invention, there is provided a method of fabrication of a semiconductor device, including the additional step of modifying a surface of a resin film by decarbonization processing.

As stated above, in the method of fabrication of the semiconductor device according to the eleventh aspect of the present invention, the decarbonization processing is carried out so that a surface of a silicone ladder series resin film is modified to form an inorganic oxide film, thereby enabling use of an etching gas containing no oxygen. It is thereby possible to carry out highly accurate patterning, and provide a through-hole in an interlayer film in a process employing typical dry etching using the gas containing no oxygen.

According to the twelfth aspect of the present invention, there is provided a method of fabrication of a semiconductor device, including the additional step of forming an inorganic film made of silicon oxide on at least any one of an upper layer and a lower layer of a resin film.

As stated above, in the method of fabrication of the semiconductor device according to the twelfth aspect of the present invention, the inorganic film is made of the silicon oxide so that an etching rate can be controlled. Further, a contact hole can be formed by only one etching process to have a side wall which is free from irregularity even when an interlayer film has a multilayer structure including a silicone ladder series resin film and the inorganic film made of silicon oxide.

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention.

DETAILED DESCRIPTION OF THE PREFERRED EMBODIMENTS

Figure 1A:
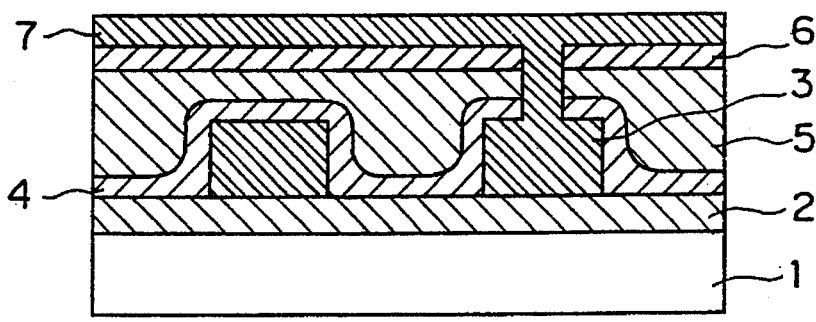
FIGS. 1(a) to 1(d) are sectional views showing a structure of a semiconductor device according to one embodiment of the present invention.

A schematic description will now be given of the present invention.

The present invention is characterized by that a silicone ladder series resin film is used as an interlayer insulating film in a multilayer interconnection structure on a semiconductor substrate, and that a cured film made of silicone ladder polymers which are represented by the following chemical formula (I):

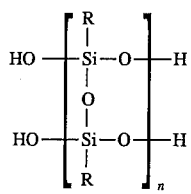

(where: R respectively denote the same or different hydrogen atoms, lower alkyl groups, or phenyl groups; and n is an integer which is sufficient to obtain a weight average molecular weight of 2,000 to 100,000) is employed as silicone series resin. It is thereby possible to provide the interlayer insulating film causing little outgassing and having excellent flatness by only one coating.

Though the silicone ladder polymer can provide a good bond performance to a primary coat because of "—OH" at an end of a molecular chain, the silicone ladder polymer causes little gas discharge (i.e., little outgassing) adversely affecting other layers since "—OH" is absent in its side chains.

Further, the silicone ladder polymer exhibits poor resistance to crack in case of molecular weight less than 2,000, and exhibits a poor plugging performance in case of the molecular weight exceeding 100,000.

In this case, the cured film may contain hydrogen silsesquioxane, or a silicone polymer containing hydroxyl groups in side chains. Alternatively, the cured film may contain a silane coupling agent in the range of 150 to 100,000 ppm. It is thereby possible to improve a bond performance to upper and lower layers.

On the other hand, according to the present invention, a flattening film is formed by applying and thermosetting a resinous solution. The resinous solution has such a composition that an organic solvent is added to the silicone ladder polymer represented by the chemical formula (I) so as to provide a concentration in the range of 5 to 30 weight percent (hereinafter abbreviated wt %).

This is why the flatness becomes poor when a solid content concentration is less than 5%, and the plugging performance is degraded in case of the concentration exceeding 30%.

As the organic solvent, a solution may be used to contain any one of or mixture of an aromatic series organic solvent, an alcohol series organic solvent, an ester series organic solvent, an ether series organic solvent, and a ketone series organic solvent.

As the aromatic series organic solvent, a solution may be used to contain any one of or mixture of methoxybenzene, ethoxybenzene, toluene, 1,2,3,4-tetrahydronaphthalene, and so forth. As the alcohol series organic solvent, a solution may be used to contain any one of or mixture of methanol, ethanol, 1-propanol, 2-propanol, 1-butanol, 2-butanol, tert-butanol, and so forth. As the ester series organic solvent, a solution may be used to contain any one of or mixture of methyl acetate, ethyl acetate, propyl acetate, isopropyl acetate, butyl acetate, isobutyl acetate, sec-butyl acetate, pentyl acetate, isopentyl acetate, and so forth.

Further, as the ketone series organic solvent, a solution may be used to contain any one of or mixture of acetone, methyl ethyl ketone, methyl isobutyl ketone, and cyclohexanone. As the ether series organic solvent, a solution may be used to contain any one of or mixture of ethylene glycol dimethyl ether, ethylene glycol diethyl ether, diethylene glycol dimethyl ether, diethylene glycol diethyl ether, and so forth.

According to the present invention, one silicone ladder polymer material having a high molecular weight and the other silicone ladder polymer having a low molecular weight are mixed together for the purpose of improvement of a bond performance of the silicone ladder polymer to the primary coat.

Preferably, one silicone ladder polymer having a weight average molecular weight of 30,000 or more is mixed with another silicone ladder polymer having a low molecular weight less than 30,000.

A type of the mixed silicone ladder polymer having the low molecular weight may be identical with or different from a type of the silicone ladder polymer having the high molecular weight. An amount of addition of the low molecular weight material is preferably more than or equal to 20 wt % with respect to the high molecular weight material.

The addition of the low molecular weight material is effective in, as well as the bond performance to the primary coat, the flatness and the plugging performance at the time of coating because of a variation generated in a coating characteristic.

For the above purpose, it is also effective to add another inorganic or organic solution (hereinafter referred to as inorganic SOG solution or organic SOG solution) used for the SOG coating method, employing hydrogen silsesquioxane, or a silicone polymer containing hydroxyl groups in side chains.

An amount of addition of the hydrogen silsesquioxane is preferably in the range of 20 to 60 wt % with respect to the silicone ladder polymer. The amount less than 20 wt % can not provide an effect, and the amount exceeding 60 wt % causes poor resistance to crack.

An amount of addition of the inorganic SOG solution or the organic SOG solution is preferably in the range of 5 to 40 wt % with respect to silicone ladder series resin coating liquid. The amount less than 5 wt % can not provide an effect, and the amount exceeding 40 wt % may cause a problem of wiring reliability due to a large amount of discharged gases.

The inorganic SOG solution used herein may include commercially available OCD T-2 (produced and sold by Tokyo Ohka Kogyo Co., Ltd., available in Japan: the same shall apply hereinafter), SF2700 (Sumitomo Chemical Co., Ltd.), HSG-2000 (Hitachi Chemical Co., Ltd.), and so forth.

Further, the organic SOG solution may include commercially available OCD T-7 (Tokyo Ohka Kogyo Co., Ltd.), SF1000 (Sumitomo Chemical Co., Ltd.), HSG-2200 (Hitachi Chemical Co., Ltd.), and so forth.

In addition, according to the present invention, a silane coupling agent in the range of 150 to 100,000 ppm with respect to a resin content is added to the silicone ladder series resin coating liquid in order to improve a bond performance.

When an amount of addition of the silane coupling agent is less than 150 ppm, it is impossible to provide an effect of an improved bond performance. The amount exceeding 100,000 ppm results in degraded film quality of the silicone ladder series resin film after thermosetting and forming the film.

As set forth above, in a method of patterning the silicone series resin film, a dry etching is generally employed in which an oxygen-containing gas mixed $CF_4$ with $CHF_3$ is used, and an etching rate ratio is controlled by an amount of addition of the oxygen.

However, in this method, a variation in an oxygen content of the etching gas may cause a major problem in selectivity of a resist used during the patterning, and may adversely affect other processes.

For example, the silicone ladder polymer having the phenyl groups in side chains of the chemical formula represented by the chemical formula (I) can be effectively used for the interlayer film requiring heat resistance. However, because of a high carbon content of the silicone ladder polymer, a gas containing a large amount of oxygen is required as the etching gas during the patterning.

Hence, since it is impossible to provide a large etching ratio of the silicone ladder polymer and the resist mask used during the patterning, accuracy of the patterning is lost.

After having studied a solution to overcome the problem, the present inventors could find that the etching rate could be controlled by the carbon content of the interlayer film.

This shows that, when a film is formed by the same process, the etching rate of the silicone series resin depends upon only the carbon content of the silicone resin, and is not affected by, for example, a structure of an organic group forming the silicone resin.

That is, it is possible to control the carbon content by selecting a type of the side chain of the silicone ladder polymer represented by the chemical formula (I). The control can be also made by mixing two or more types of silicone ladder polymers having different carbon contents.

Further, it is possible to adjust the carbon content by a mixing ratio of the silicone ladder polymer and inorganic hydrogen silsesquioxane, or by an amount of the inorganic SOG solution or the organic SOG solution which is added to the silicone ladder series resin coating liquid.

On the other hand, for the above purpose, decarbonization processing may be carried out to etch the organic SOG such as silicone ladder series resins having a high carbon content. The processing includes plasma processing using an inactive gas, and so forth.

The decarbonization processing modifies a surface of the silicone ladder series resin film to form an inorganic oxide film so that an etching gas containing no oxygen can be used in the dry etching for forming a pattern.

As a result, it is possible to provide a large etching ratio of the silicone ladder series resin film and the resist mask used during the patterning so as to enable highly accurate patterning, and to provide a through-hole in the interlayer film by the process employing the typical dry etching using the gas containing no oxygen.

Even when the interlayer film has a multilayer structure including the silicone ladder series resin film and an inorganic film made of silicon oxide by CVD, the same etching ratio can be provided for the silicone ladder series resin film and the inorganic film by controlling the etching rate as described above.

It is thereby possible to provide, by only one etching processing, a contact hole whose side wall has no irregularity even in the interlayer film having the multilayer structure including the silicone ladder series resin film and the inorganic film made of the silicon oxide.

A detailed description will now be given of one embodiment of the present invention referring to the accompanying drawings.

EXAMPLE 1

FIGS. 1(a) to 1(d) are sectional views partially showing a semiconductor device according to one embodiment of the present invention.

In the drawings, reference numeral 1 means a silicon semiconductor substrate with circuit elements, 2 is an insulating film formed on the semiconductor substrate 1, 3 is a first Al wiring layer formed on the insulating film 2, 4 is a silicon oxide film made by a plasma CVD method to cover the first Al wiring layer 3, 5 is a resin film which was formed on the silicon oxide film 4 and was made of the silicone ladder series resins represented by the chemical formula (I) as described above, 6 is a silicon oxide film formed on the resin film 5, and 7 is a second Al wiring layer formed on the silicon oxide film 6.

The first Al wiring layer 3 and the second Al wiring layer 7 are connected through a contact hole which was provided in an interlayer film at a predetermined position, including the silicon oxide film 4, the resin film 5, the silicon oxide film 6, and so forth.

FIG. 1(a) shows a state in which the first Al wiring layer 3 and the second Al wiring layer 7 are separated by the interlayer film having a three-layer structure including the silicon oxide film 4, the resin film 5, the silicon oxide film 6, and so forth.

Figure 1B:
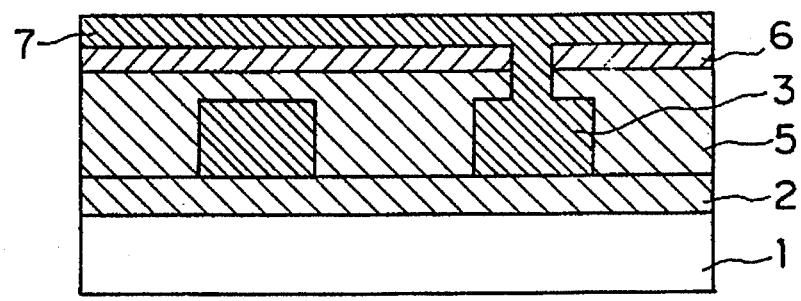

FIG. 1(b) shows a state in which the first Al wiring layer 3 and the second Al wiring layer 7 are separated by the interlayer film having a two-layer structure including the resin film 5, and the silicon oxide film 6.

Figure 1C:
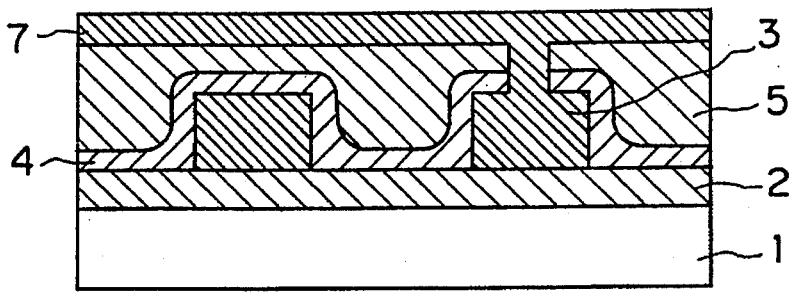

FIG. 1(c) shows a state in which the first Al wiring layer 3 and the second Al wiring layer 7 are separated by the interlayer film having a two-layer structure including the silicon oxide film 4 and the resin film 5.

Figure 1D:
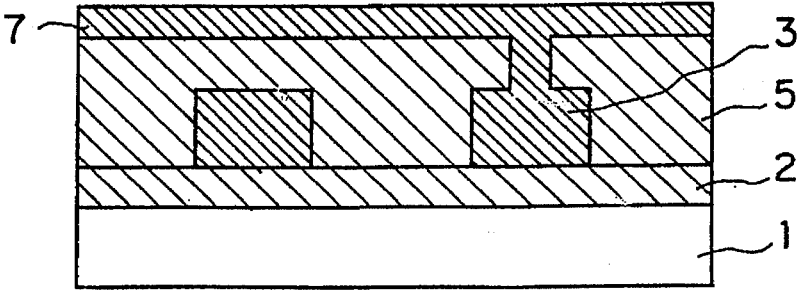

FIG. 1(d) shows a state in which the first Al wiring layer 3 and the second Al wiring layer 7 are separated by the interlayer film including one layer, i.e., the resin film 5.

The silicon oxide film was formed on or under the resin film 5 by the CVD method or the like, thereby improving reliability of the semiconductor device such as strength, or electric characteristic.

A description will now be given of a method of fabrication of the semiconductor device shown in FIG. 1(a) referring to FIGS. 2(a) to 2(d).

In the first step, the insulating film 2 was formed on the semiconductor substrate 1, and an Al film was deposited on the semiconductor substrate by a sputtering method or the like. Further, a given photolithography technique was used for patterning to form the first Al wiring layer 3.

Subsequently, the silicon oxide film 4 was formed by the plasma CVD method on the first Al wiring layer 3 which was formed on the semiconductor substrate 1.

The silicon oxide film 4 was spin-coated with a silicone ladder polymer solution.

A main dissolved substance in the silicone ladder polymer solution was a silicone ladder polymer which had a weight average molecular weight of 20,000, and is represented by the following chemical formula (II):

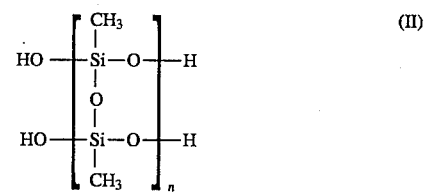

(where n denotes an integer which is sufficient to obtain the weight average molecular weight of 20,000)

An n-butyl acetate/1-butanol (4/1) mixed solution was used as solvent of the silicone ladder polymer solution, and the above substance is dissolved to provide a concentration of 15 wt %.

Glycidoxypropyltrimethoxysilane (Model:"KBM-403E", a product of Shin-Etsu Chemical Co., Ltd.) was employed as an additive to serve as a silane coupling agent with a concentration of 1,000 ppm with respect to a silicone ladder polymer resin content.

The silane coupling agent may be later added to the silicone ladder polymer resinous solution as described above, or the silane coupling agent may be initially dissolved in the solvent and thereafter the silicone ladder polymer resin may be dissolved in the solvent. Alternatively, it is also possible to mix one solution of the silane coupling agent with another solution of the silicone ladder polymer resin.

The silicone ladder polymer solution was spin-coated, and was thereafter heat-treated for thirty minutes at each of temperatures of 150° C. and 250° C. The silicone ladder polymer solution was further heat-treated at the temperature of 400° C. for one hour, thereby thermostting the applied silicone ladder polymer film to form the resin film 5.

The silicone ladder polymer containing the hydroxyl groups in side chains, represented by the chemical formula (II), is a method disclosed in Japanese Patent Application No. 4-340638 which is incorporated herein in its entirety.

The silicone ladder polymer produced according to the method was a high-purity silicone ladder polymer containing 1 ppm or below of each of sodium, potassium, iron, copper, lead and hydrogen chloride, and 1 ppb or below of each of uranium and thorium, that is, having an extremely low impurity content.

Hence, the interlayer insulating film made of the silicone ladder polymer could exhibit excellent heat resistance, and contributed to improvement of reliability b cause of good controllability and a little variation in characteristics in a molecular weight distribution of 10 or less.

Figure 2A:
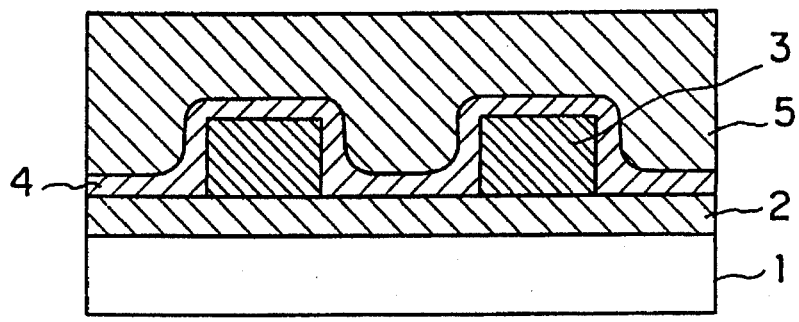
FIGS. 2(a) to 2(d) are sectional views showing, in the order of process, a method of fabrication of the semiconductor device according to one embodiment of the present invention.
Figure 2B:
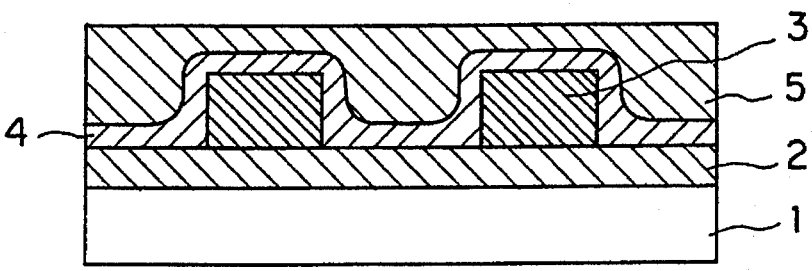

Next, as shown in FIG. 2(b), isotropic etching was made to the resin film 5 by a $CF_4$ series gas to improve its flatness and eliminate or reduce a thickness thereof above a wiring pattern of the first Al wiring layer 3.

Figure 2C:
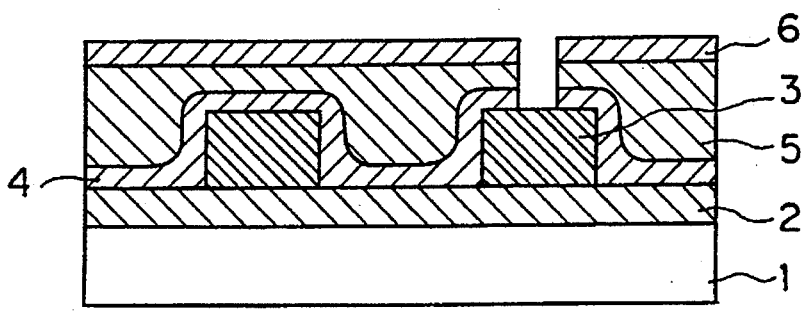

Subsequently, the silicon oxide film 6 was formed on the resin film 5 by the CVD method to form the interlayer insulating film having the three-layer structure. As shown in FIG. 2(c), a predetermined position of the interlayer insulating film having the three-layer structure was etched according to a typical method to provide a contact hole.

Figure 2D:
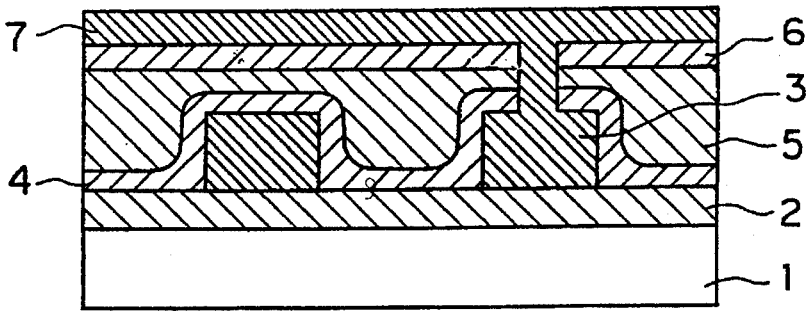

As shown in FIG. 2(d), the second Al wiring layer 7 was formed thereon by the sputtering method or the like, and the patterning was carried out to provide a desired form so as to connect the second Al wiring layer 7 to the first Al wiring layer 3.

As set forth above, in the interlayer insulating film of the semiconductor device in Example 1, the resin film 5 for flattening was made of silicone ladder series resin having a high molecular weight. Therefore, it was possible to provide sufficient flatness without crack even when a thick film was formed by one coating.

Further, a good bond performance could be provided between the film and a primary coat or an upper film because of the addition of the silane coupling agent.

In addition, a small amount of gas was discharged at temperatures of 500° C. or less, and even if the Al wiring 7 is formed in the through-hole in which the resin film 5 is exposed, no failure occurs in the Al wiring 7, resulting in excellent long-term reliability.

EXAMPLE 2

A semiconductor device shown in FIG. 1(b) according to the present invention was produced by using the same method as that in Example 1.

In this case, omission was made to the step of forming a silicon oxide film 4 after patterning of a first Al wiring layer 3 in FIG. 2(a), and instead thereof a resin film 5 was formed after the patterning of the first Al wiring layer 3.

In the semiconductor device of Example 2, it was possible to provide an interlayer film having good resistance to crack and sufficient flatness.

Further, an excellent bond performance could be provided between a film 5 and a primary coat or an upper film, and no failure occurred in the first Al wiring layer 3 or aluminium in a through-hole.

EXAMPLE 3

A semiconductor device shown in FIG. 1(c) according to the present invention was produced by using the same method as that in Example 1.

In this case, omission was made to the step of forming a silicon oxide film 6 after etch back of a resin film 5 in FIG. 2(c), and instead thereof a through-hole was provided after the etch back of the resin film 5 to form a second Al wiring layer 7 serving as a second layer.

In the semiconductor device of Example 3, it was also possible to provide an interlayer film having good resistance to crack and sufficient flatness.

Further, an excellent bond performance could be provided between the film 5 and a primary coat or an upper film, and no failure occurred in the second Al wiring layer 7 or aluminium in the through-hole.

EXAMPLE 4

A semiconductor device shown in FIG. 1(d) according to the present invention was produced by using the same method as that in Example 1.

In this case, omission was made to the step of forming a silicon oxide film 4 and a silicon oxide film 6. Instead thereof, an interlayer insulating film included only a resin film 5, and a through-hole was provided in the interlayer insulating film to form a second Al wiring layer.

In the semiconductor device of Example 4, it was also possible to provide an interlayer film having good resistance to crack and sufficient flatness.

Further, an excellent bond performance could be provided between the film 5 and a primary coat or an upper film, and no failure occurred in a first Al wiring layer 3, the second Al wiring layer 7, or aluminum in the through-hole.

EXAMPLES 5 to 16

In the Examples 1 to 4, the resin film 5 was formed by using, as a main dissolved substance in the silicone ladder polymer solution, polymethylsilsesquioxane which had a weight average molecular weight of 20,000 and is represented by the chemical formula (II). Further, the n-butyl acetate/1-butanol (a mixed ratio of 4/1) mixed solution was used as solvent, and the above substance was dissolved in the solvent to have a concentration of 15 wt %. Furthermore, glycidoxypropyltrimethoxysilane was employed as an additive with a concentration of 1,000 ppm with respect to the silicone ladder polymer resin content. However, it must be noted that the present invention should not be limited to this.

Compositions of the silicone ladder polymer solution to form the resin film 5 may be combined as shown in Table 1 below.

TABLE 1

| Ex. | Silicone Ladder Polymer Name/Molecular Wt. | Solvent | Concentration (wt %) | Silane Coupling Agent Name/Amount (ppm) |
|---|---|---|---|---|
| 5 | polymethylsilsesquioxane 20,000 | Methoxybenzene | 13 | glycidoxypropyltrimethoxysilane: 1,000 |
| 6 | polymethylsilsesquioxane 20,000 | Methoxybenzene/Ethoxybenzene = 1/1 | 15 | glycidoxypropyltrimethoxysilane: 1,000 |
| 7 | polyphenylsilsesquioxane 2,000 | Methoxybenzene | 18 | glycidoxypropyltrimethoxysilane: 1,000 |
| 8 | polyphenylsilsesquioxane 2,000 | Methoxybenzene/Ethoxybenzene = 1/1 | 20 | glycidoxypropyltrimethoxysilane: 1,000 |
| 9 | polymethylphenylsilsesquioxane (Me:Ph = 1:1) 20,000 | Methoxybenzene/Ethoxybenzene = 1/1 | 18 | glycidoxypropyltrimethoxysilane: 1,000 |
| 10 | polymethylsilsesquioxane 25,000 | n-butyl acetate | 15 | glycidoxypropyltrimethoxysilane: 1,000 |
| 11 | polymethylsilsesquioxane 2,000 | n-butyl acetate | 30 | glycidoxypropyltrimethoxysilane: 1,000 |
| 12 | polymethylphenylsilsesquioxane (Me:Ph = 2:1) 10,000 | n-butyl acetate/1-butanol = 1/1 | 18 | glycidoxypropyltrimethoxysilane: 1,000 |
| 13 | polymethylsilsesquioxane 20,000 | diethylene glycol dimethyl ether | 15 | glycidoxypropyltrimethoxysilane: 1,000 |
| 14 | polyphenylsilsesquioxane 2,000 | diethylene glycol dimethyl ether | 20 | glycidoxypropyltrimethoxysilane: 1,000 |
| 15 | polymethylphenylsilsesquioxane (Me: Ph = 2.1) 5,000 | diethylene glycol dimethyl ether | 20 | glycidoxypropyltrimethoxysilane: 1,000 |
| 16 | polymethylsilsesquioxane 10,000 | n-butyl acetate | 5 | glycidoxypropyltrimethoxysilane: 1,000 |

The silicone ladder polymers listed in the Table 1 were produced according to methods stated in Japanese pending Patent Applications Nos. 4-340638 and 4-208994, and Japanese Patent Publication (Kokai) 1-92224 to have a structure which is represented by the following chemical formula (III):

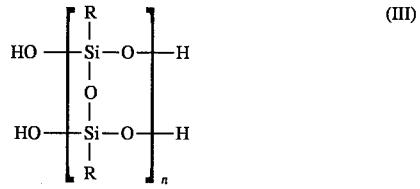

(III)

(where: R respectively denote the same or different methyl groups, or phenyl groups; and n is an integer which is sufficient to obtain a weight average molecular weight in the range of 2,000 to 100,000).

The silicone ladder polymers listed in the Table 1 were high-purity silicone ladder polymers containing 1 ppm or below of each of sodium, potassium, iron, copper, lead and hydrogen chloride, and 1 ppb or below of each of uranium and thorium, that is, having an extremely low impurity content.

Hence, the resin film 5 (i.e., an interlayer insulating film) made of the silicone ladder polymer could exhibit excellent heat resistance, and contributed to improvement of reliability because of good controllability and a little variation in characteristics in a molecular weight distribution of 10 or less.

It was also possible to provide an interlayer film having good resistance to crack and sufficient flatness in a semiconductor device using the resin film 5 which was formed by the silicone ladder polymer solution according to the combinations in Examples 5 to 17.

Further, an excellent bond performance could be provided between the film 5 and a primary coat or an upper film, and no failure occurred in a first Al wiring layer 3, a second Al wiring layer 7, or aluminium in the through-hole.

EXAMPLES 17 to 20

Though only one type of silicone ladder polymer was employed in the above Examples, it must be noted that the present invention should not be limited to this.

As set forth above, it is necessary to improve a bond performance of the silicone ladder polymer having a large weight average molecular weight of 30,000 or more to a primary coat. For this purpose, as shown in Table 2 below, another silicone ladder polymer having a lower molecular weight was mixed with the silicone ladder polymer.

TABLE 2

| Ex. | Silicone Ladder Polymer Name/Molecular Wt. | Solvent | Concentration (wt %) | Silane Coupling Agent Name/Amount (ppm) |
|---|---|---|---|---|
| 17 | a) polymethylsilsesquioxane 50,000 b) polymethylsilsesquioxane 5,000 a:b = 1:1 | n-butyl acetate | 15 | glycidoxypropyltrimethoxysilane: 1,000 |
| 18 | a) polymethylsilsesquioxane 50,000 b) polymethylsilsesquioxane 5,000 a:b = 5:1 | n-butyl acetate | 13 | glycidoxypropyltrimethoxysilane: 1,000 |
| 19 | a) polyphenylsilsesquioxane 35,000 b) polymethylsilsesquioxane 5,000 | Methoxybenzene/Ethoxybenzene = 1:1 | 13 | glycidoxypropyltrimethoxysilane: 1,000 |

TABLE 2-continued

| Ex. | Silicone Ladder Polymer Name/Molecular Wt. | Solvent | Concentration (wt %) | Silane Coupling Agent Name/Amount (ppm) |
|---|---|---|---|---|
| 20 | a) polyphenylsilsesquioxane 35,000<br>b) polyphenylsilsesquioxane 5,000<br>a:b = 1:1 | Methoxybenzene/Ethoxybenzene = 1:1 | 13 | glycidoxypropyltrimethoxysilane: 1,000 |

For example, as shown in Example 18, both polymethyl silsesquioxane having weight average molecular weights of 50,000 and 5,000 may be mixed in the ratio of 1:1 to dissolve in n-butyl acetate so as to provide a concentration of 15 wt %. Further, a resin film 5 (FIG. 2) may be formed by using a silicone ladder polymer solution in which glycidoxypropyltrimethoxysilane of 1,000 ppm is added to the silicone ladder polymer.

In semiconductor devices in the Examples, it was also possible to provide an interlayer film having good resistance to crack and sufficient flatness.

Further, an excellent bond performance could be provided between the resin film 5 and the primary coat or an upper film, and no failure occurred in Al wiring layers 3 and 7, or aluminum in the through-hole.

EXAMPLES 21 to 30

Though glycidoxypropyltrimethoxysilane of 1,000 ppm serving as a silane coupling agent was added to improve a bond performance in the Examples, it must be noted that the present invention should not be limited to this.

As shown in Table 3 below, an amount of γ-glycidoxypropyltrimethoxysilane may be in the range of 150 to 100,000 ppm, and another silane coupling agent may be used for the same purpose.

In semiconductor devices in the Examples, it was also possible to provide an interlayer film having good resistance to crack and sufficient flatness. Further, an excellent bond performance could be provided between a resin film 5 and a primary coat or an upper film, and no failure occurred in aluminum in the through-hole.

EXAMPLES 31 to 33

Though the silane coupling agent was employed as additives for improving a bond performance in the above Examples, it must be noted that the present invention should not be limited to this. It is also possible to provide the same effect by adding hydrogen silsesquioxane, another inorganic SOG or organic SOG solution.

As shown in Table 4, hydrogen silsesquioxane (HSQ) may be added in the range of 20 to 60 wt %.

The amount of the added HSQ less than 20 wt % can not provide an effect of an improved bond performance, and the amount exceeding 60 wt % causes poor resistance to crack during thermostting operation.

TABLE 4

| Ex. | Silicone Ladder Polymer Name/Molecular Wt. | Solvent | Concentration (wt %) | Amount of added HSQ |
|---|---|---|---|---|
| 31 | polymethyl-silsesquioxane 25,000 | n-butyl acetate | 15 | 30 wt % |
| 32 | polymethyl-silsesquioxane 25,000 | n-butyl acetate | 15 | 20 wt % |
| 33 | polymethyl-silsesquioxane 25,000 | n-butyl acetate | 15 | 60 wt % |

TABLE 3

| Ex. | Silicone Ladder Polymer Name/Molecular Wt. | Solvent | Concentration (wt %) | Silane Coupling Agent Name/Amount (ppm) |
|---|---|---|---|---|
| 21 | polymethylsilsesquioxane 25,000 | n-butyl acetate | 15 | glycidoxypropyltrimethoxysilane: 150 |
| 22 | polymethylsilsesquioxane 25,000 | n-butyl acetate | 15 | glycidoxypropyltrimethoxysilane: 100,000 |
| 23 | polymethylsilsesquioxane 25,000 | n-butyl acetate | 15 | vinyltrimethoxysilane: 1,000 |
| 24 | polymethylsilsesquioxane 25,000 | n-butyl acetate | 15 | vinyltriethoxysilane: 1,000 |
| 25 | polymethylsilsesquioxane 25,000 | n-butyl acetate | 15 | β-(3,4-epoxycyclohexyl)ethyl trimethoxy silane: 1,000 |
| 26 | polymethylsilsesquioxane 25,000 | n-butyl acetate | 15 | glycidoxypropyltrimethoxysilane: 1,000 |
| 27 | polymethylsilsesquioxane 25,000 | n-butyl acetate | 15 | N-β(aminoethyl)-γ-aminopropyl trimethoxy silane: 1,000 |
| 28 | polymethylsilsesquioxane 25,000 | n-butyl acetate | 15 | N-β(aminoethyl)-γ-aminopropyl methyldimethoxy silane: 1,000 |
| 29 | polymethylsilsesquioxane 25,000 | n-butyl acetate | 15 | β-aminopropyl trimethoxy silane: 1,000 |
| 30 | polymethylsilsesquioxane 25,000 | n-butyl acetate | 15 | N-phenyl-γ-aminopropyl trimethoxy silane: 1,000 |

EXAMPLES 34 to 39

Further, it was possible to similarly improve a bond performance by using commercially available SOG solutions as shown in Table 5 below as another inorganic SOG or organic SOG solution.

In Table 5, reference numeral T-7(12500T) means an organic SOG, and T-2(P-48340) is an inorganic SOG.

As shown in the Comparative Example 1 in Table 6, the formed silicone ladder polymer film was separated from a primary coat without addition of the silane coupling agent. In particular, the separation easily occurred on a first Al wiring layer 3.

TABLE 5

| Ex. | Silicone Ladder Polymer Name/Molecular Wt. | Solvent | Concentration (wt %) | Concentration of Commercially available SOG (Tokyo Ohka Kogyo Co., Ltd.) |
| --- | --- | --- | --- | --- |
| 34 | polymethyl-silsesquioxane 25,000 | n-butyl acetate | 15 | T-7(12500T) 10 wt % |
| 35 | polymethyl-silsesquioxane 25,000 | n-butyl acetate | 15 | T-7(12500T) 5 wt % |
| 36 | polymethyl-silsesquioxane 25,000 | n-butyl acetate | 15 | T-7(12500T) 40 wt % |
| 37 | polymethyl-silsesquioxane 25,000 | n-butyl acetate | 15 | T-2(P-48340) 10 wt % |
| 38 | polymethyl-silsesquioxane 25,000 | n-butyl acetate | 15 | T-2(P-48340) 5 wt % |
| 39 | polymethyl-silsesquioxane 25,000 | n-butyl acetate | 15 | T-2(P-48340) 40 wt % |

COMPARATIVE EXAMPLES 1 to 12

As Comparative Examples to the above Examples, a silicone ladder polymer film corresponding to a resin film 5 shown in FIG. 2 was formed by using silicone ladder polymer solutions which were prepared according to combinations listed in Table 6 below.

Alternatively, a bond performance to the primary coat was poor due to a small amount of the added silane coupling agent as shown in the Comparative Example 2 in Table 6. Further, a drawback was caused in quality of the formed silicone ladder polymer film due to a large amount of the

TABLE 6

| Comp. Ex. | Silicone Ladder Polymer Name/Molecular Wt. | Solvent | Concentration (wt %) | Silane Coupling Agent Name/Amount |
| --- | --- | --- | --- | --- |
| 1 | polymethylsilsesquioxane 25,000 | n-butyl acetate | 15 | Non |
| 2 | polymethylsilsesquioxane 25,000 | n-butyl acetate | 15 | glycidoxypropyltrimethoxysilane: 100 ppm |
| 3 | polymethylsilsesquioxane 25,000 | n-butyl acetate | 15 | glycidoxypropyltrimethoxysilane: 150,000 ppm |
| 4 | polymethylsilsesquioxane 150,000 | n-butyl acetate | 5 | glycidoxypropyltrimethoxysilane: 1,000 ppm |
| 5 | polymethylsilsesquioxane 100,000 | n-butyl acetate | 3 | glycidoxypropyltrimethoxysilane: 1,000 ppm |
| 6 | polymethylsilsesquioxane 2,000 | n-butyl acetate | 35 | glycidoxypropyltrimethoxysilane: 1,000 ppm |
| 7 | polymethylsilsesquioxane 25,000 | n-butyl acetate | 15 | HSQ: 15 wt % |
| 8 | polymethylsilsesquioxane 25,000 | n-butyl acetate | 15 | HSQ: 65 wt % |
| 9 | polymethylsilsesquioxane 25,000 | diethylene glycol dimethyl ether | 15 | T-7(12500T), [Tokyo Ohka Kogyo Co., Ltd.]: 3 wt % |
| 10 | polymethylsilsesquioxane 25,000 | diethylene glycol dimethyl ether | 15 | T-7(12500T), [Tokyo Ohka Kogyo Co., Ltd.]: 45 wt % |
| 11 | polymethylsilsesquioxane 25,000 | n-butyl acetate | 15 | T-2(P-48340), [Tokyo Ohka Kogyo Co., Ltd.]: 3 wt % |
| 12 | polymethylsilsesquioxane 25,000 | n-butyl acetate | 15 | T-2(P-48340), [Tokyo Ohka Kogyo Co., Ltd.]: 45 wt % | added silane coupling agent as shown in the Comparative Example 3.

As shown in the Comparative Examples 4 and 5 in Table 6, the silicone ladder polymers having molecular weights exceeding 100,000 resulted in a degraded plugging performance in coating, and caused a poor bond performance to a primary coat due to a small amount of —OH groups at ends. On the other hand, the silicone ladder polymer having a low polymer concentration as shown in the Comparative Example 6 in Table 6 provided poor flatness in the coating.

Further, as shown in the Comparative Examples 7 and 8 in Table 6, a small amount of added HSQ caused a poor bond performance, and a large amount thereof caused a drawback in the quality of the film as in the silane coupling agent.

A small amount of added SOG caused a poor bond performance as shown in the Comparative Examples 9 and 11 in Table 6, and a large amount thereof inversely affected an Al wiring.

EXAMPLE 41

Figure 3:
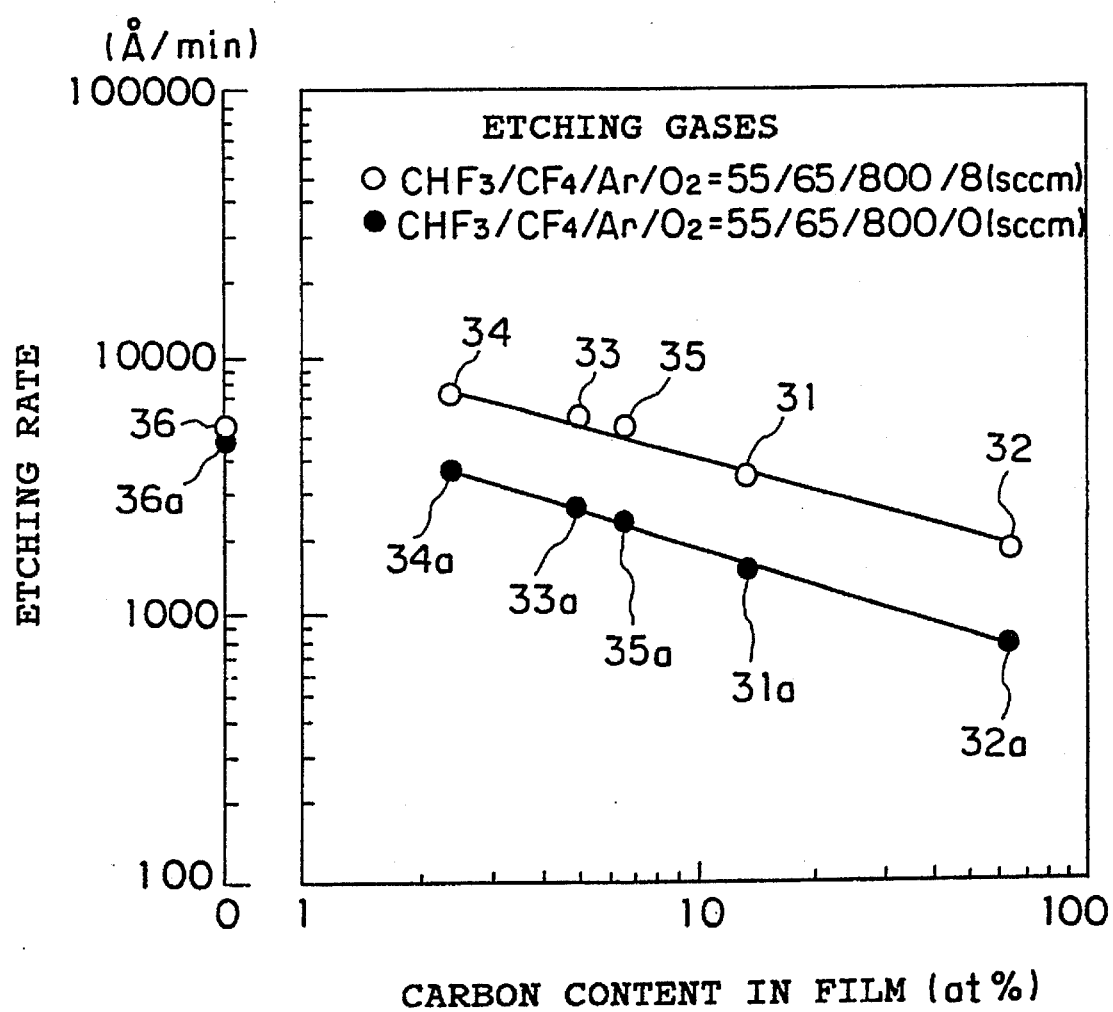
FIG. 3 is an explanatory view showing a relationship between a carbon content of silicone resin and an etching rate.

FIG. 3 is an explanatory view showing a relationship between a carbon content of silicone resin and an etching rate.

In the drawing, reference numerals 31 and 31a mean polymethylsilsesquioxane, 32 and 32a are polyphenyl silsesquioxane, 33 and 33a are T-7(12500T) [an organic SOG material of Tokyo Ohka Kogyo Co., Ltd.], 34 and 34a are T-7(12500TA) [an organic SOG material of Tokyo Ohka Kogyo Co., Ltd.], 35 and 35a are SF1014 [an organic SOG material of Sumitomo Chemical Co., Ltd.] under each condition of an etching gas containing oxygen or containing no oxygen.

Reference numerals 36 and 36a mean an etching rate for a silicon oxide film according to a plasma CVD method, and the silicon oxide film had a carbon content of 0%.

The respective carbon contents of the films were obtained by the results of measurement.

As seen from the drawing, the etching rate depended upon only the carbon content irrespective of, for example, types of organic groups or structures of polymers contained in the films.

When a gas containing no oxygen is used according to the etching condition as shown in FIG. 3, the carbon content may be set at about 40 wt % in order to, for example, set the etching rate at 1,000 (angstroms/min).

In order to provide an interlayer flattening film having a controlled carbon content of 40 wt %, polymethylphenylsilsesquioxane shown in the chemical formula (III) was composed to have a methyl group to phenyl group ratio of 40.1:59.9 according to a method disclosed in Japanese Patent Application No. 4-208994.

Further, coating liquid of the polymer was prepared and used to form the interlayer flattening film.

A measured etching rate of the film was 983 (angstroms/min) which was substantially identical with a designed value.

EXAMPLE 42

As in the Example 41, a silicone ladder polymer was prepared to have a controlled carbon content of 40 wt % in order to provide an etching rate of 1,000 (angstroms/min).

An interlayer flattening film was formed by preparing coating liquid in which polymethylsilsesquioxane (having a weight average molecular weight of 20,000) represented by the chemical formula (II) and polyphenylsilsesquioxane (having a weight average molecular weight of 2,000) represented by the following chemical formula (IV):

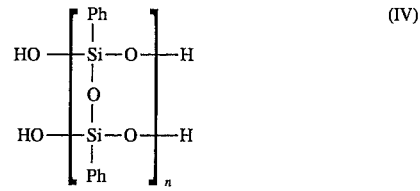

(where: Ph denotes a phenyl group; and n is an integer which is sufficient to obtain a weight average molecular weight of 2,000) were mixed at a weight ratio of 40.1:59.9.

A measured etching rate of the film was 991 (angstroms/min) which was substantially identical with a designed value.

The silicone ladder polymer having hydroxy groups at ends, represented by the chemical formula (IV), was prepared according to a method disclosed in Japanese Patent Publication (Kokai) No. 1-92224.

EXAMPLE 43

As in the Example 41, a silicone ladder polymer was prepared to have a controlled carbon content of 40 wt % in order to provide an etching rate of 1,000 (angstroms/min).

Here, an interlayer flattening film was formed by preparing coating liquid in which polyphenyl-silsesquioxane (having a weight average molecular weight of 2,000) represented by the chemical formula (IV) and hydrogen silsesquioxane were mixed at a weight ratio of 73.0:27.0.

A measured etching rate of the film was 1012 (angstroms/min) which was substantially identical with a designed value.

EXAMPLE 44

As in the Example 41, a silicone ladder polymer was prepared to have a controlled carbon content of 40 wt % in order to provide an etching rate of 1,000 (angstroms/min).

Here, an interlayer flattening film was formed by preparing coating liquid in which a solution containing 20 wt % polyphenylsilsesquioxane (having a weight average molecular weight of 2,000) represented by the chemical formula (IV) and a commercially available organic SOG solution (T-7[12500TA]; a product of Tokyo Ohka Kogyo Co., Ltd.) were mixed at a weight ratio of 71.8:28.2.

A measured etching rate of the film was 966 (angstroms/min) which was substantially identical with a designed value.

EXAMPLE 45

As in the Example 41, a silicone ladder polymer was prepared to have a controlled carbon content of 40 wt % in order to provide an etching rate of 1,000 (angstroms/min).

Here, an interlayer flattening film was formed by preparing coating liquid in which a solution containing 8.4 wt % polyphenylsilsesquioxane (having a weight average molecular weight of 2,000) represented by the chemical formula (IV) and a commercially available inorganic SOG solution (T-2[P-48340]; a product of Tokyo Ohka Kogyo Co., Ltd.) were mixed at a weight ratio of 73.0:27.0.

A measured etching rate of the film was 981 (angstroms/min) which was substantially identical with a designed value.

EXAMPLE 46

As seen from the facts, resins having different carbon contents could be mixed to control a carbon content of a formed film, thereby controlling an etching rate.

A description will now be given of a process in which, when an interlayer flattening film was formed to have a multilayer structure including a silicon oxide film made by a plasma CVD method and a silicone ladder series resin film, etching rates of the silicon oxide film and the resin film were made substantially equal to one another.

Under an etching condition employing oxygen as shown in FIG. 3, as is apparent from the drawing, a carbon content of the silicone ladder series resin may be set at about 8 wt % to provide the same etching rate as that of the silicon oxide film formed by the plasma CVD method.

Here, the silicone ladder series resin having the carbon content of about 8 wt % could be provided by using liquid in which polymethysilsesquioxane having a weight average molecular weight of about 20,000 and hydrogen silsesquioxane were mixed at a weight ratio of 56.7:43.3.

A measured etching rate of the film formed as described above was 4,431 angstroms/min which was substantially identical with a desired value.

Therefore, according to the method, it was possible control the etching rate of an interlayer film by the silicone ladder series resin without an increased oxygen content of an etching gas. As a result, no problem occurred in selectivity of etching of a resist mask used at a time to form a pattern on the layer.

EXAMPLE 47

When an interlayer insulating film was formed by a silicone ladder series resin and a silicon oxide film made by a plasma CVD method, etching rates of the different films may be made equal by modifying a silicone ladder series resin film.

FIGS. 4(a) to 4(d) are process sectional views showing a method of controlling the etching rate by modifying the silicone ladder series resin film.

In the drawing, polyphenylsilsesquioxane was used as the silicone ladder series resin film, and the process is shown to form a semiconductor device having a structure shown in FIG. 1(a).

In the Example, a resin film 5 was made of polyphenylsilsesquioxane to be etched, and a surface of the resin film 5 was modified for mineralization by decarbonization processing, thereby bringing the etching rate closer to an etching rate in silicon oxide films 4 and 6 formed by the plasma CVD method.

Hence, it was possible to employ a typical mixed gas containing not oxygen but $CF_4$ and $CHF_3$ in etching process to form a through-hole.

A description will now be given of a method of fabrication of the present invention referring to FIGS. 4(a) to 4(d).

Figure 4A:
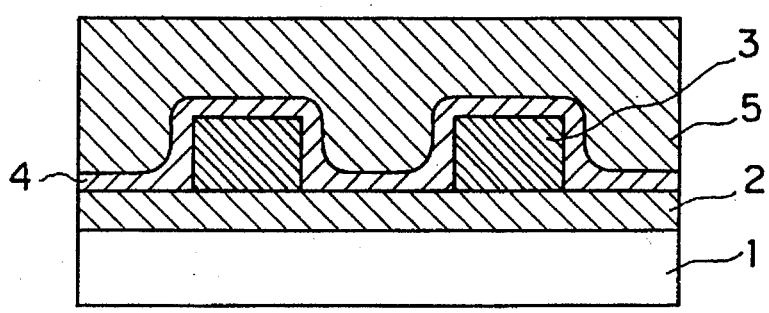
FIGS. 4(a) to 4(d) are sectional views showing, in the order of process, a method of fabrication of a semiconductor device according to another embodiment of the present invention.

In the first step, an insulating film 2 was formed on a semiconductor substrate 1 forming a semiconductor device as shown in FIG. 4(a). After a pattern of a first Al wiring layer 3 was provided on the insulating film 2, the silicon oxide film 4 was formed by the CVD method.

As silicone ladder polymer which has a weight average molecular weight of 2,000 and is represented by the chemical formula (IV), the silicon oxide film 4 was spin-coated with methoxybenzene/ethoxybenzene (1/1) mixed solution [having a concentration of 20 wt %]. The applied solution was heat-treated for 30 minutes at each of temperatures of 150° C. and 250° C., and for one hour at temperature of 400° C. to form the resin film 5.

Next, isotropic etching was made by a $CF_4$ series gas for etch back of the silicone ladder polymer film in order to provide its flatness and eliminate or reduce a thickness of the resin film 5 on the first Al wiring layer 3.

In this case, a 20 % or less amount of oxygen was preferably mixed with the etching gas to improve the etching rate and uniformity.

Figure 4B:
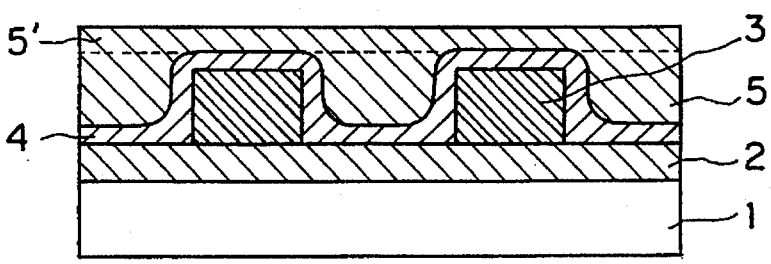

In the following process which is an important feature in the Example, a surface of the remaining resin film 5 was treated by plasma of a nitrogen gas, thereby forming an inorganic $SiO_2$ layer 5' and completely eliminating the resin film 5 on the first Al wiring layer 3 as shown in FIG. 4(b).

The surface treatment by the plasma of the nitrogen gas could serve as decarbonization processing for the surface of the remaining resin film 5.

Figure 4C:
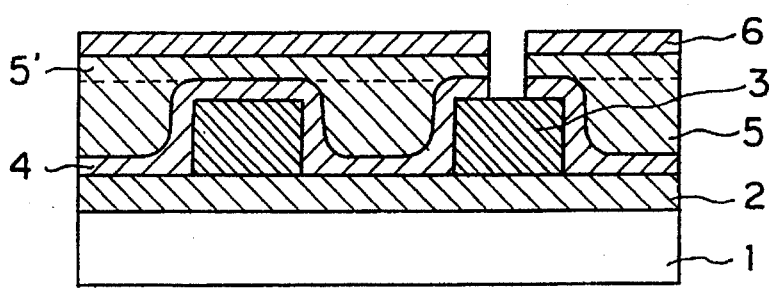

Subsequently, as shown in FIG. 4(c), the silicon oxide film 6 was formed according to the CVD method on the inorganic $SiO_2$ layer 5' of the resin film 5. Further, as shown in the same drawing, a predetermined position of the interlayer insulating film having a three-layer structure was etched to provide a contact hole according to a method using the typical mixed gas containing not oxygen but $CF_4$ and $CHF_3$.

Figure 4D:
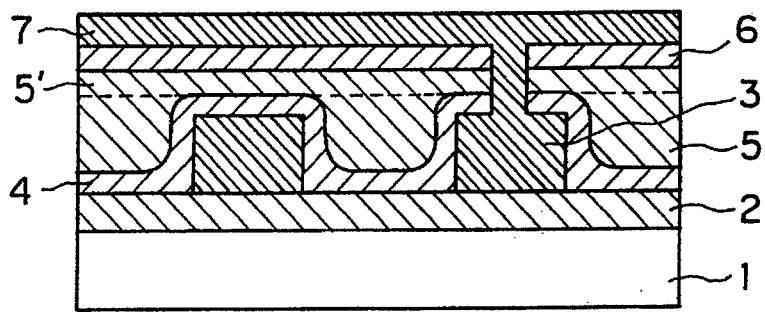
Figure 5A:
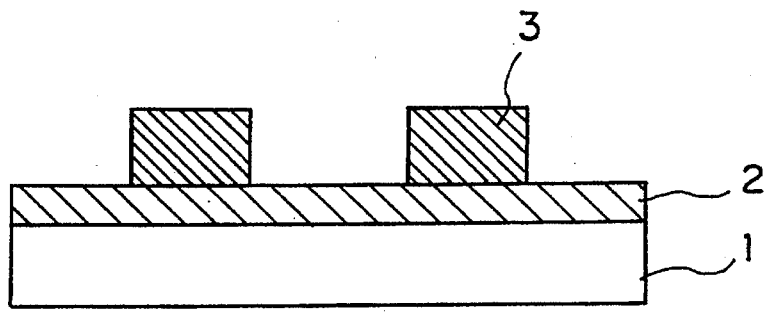
FIGS. 5(a) to 5(d) are sectional views showing, in the order of process, a method of fabrication of a conventional semiconductor device.
Figure 5B:
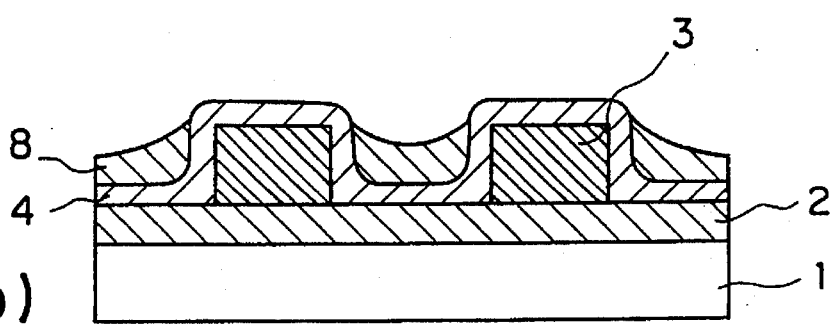
Figure 5C:
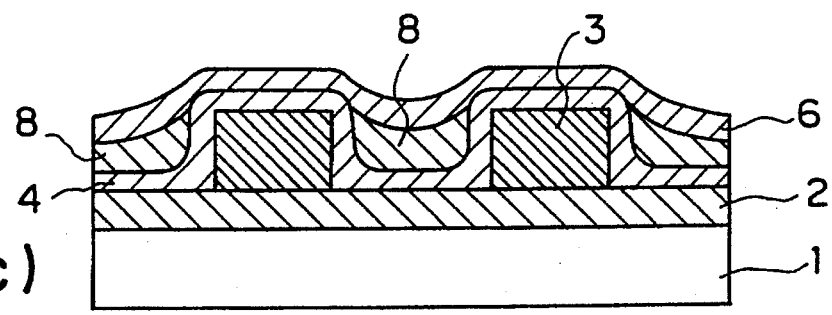
Figure 5D:
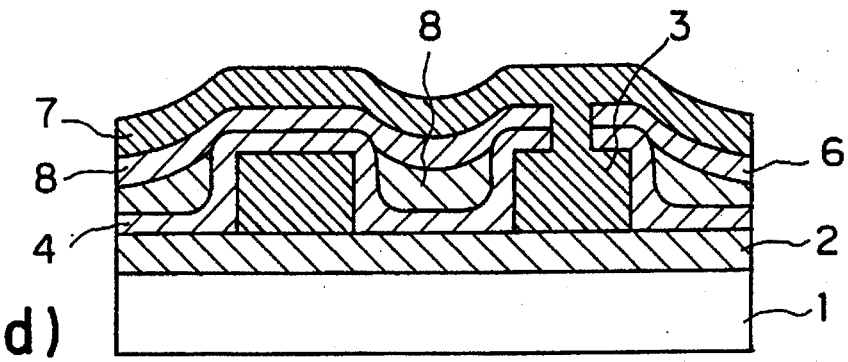

As shown in FIG. 4(d), a second Al wiring layer 7 was subsequently formed according to a sputtering method or the like, and patterning was carried out to provide a desired form of the second Al wiring layer 7 so as to connect the second Al wiring layer 7 to the first Al wiring layer 3.

It must be noted that the method of fabrication of the semiconductor device should not be limited to the resin film 5 made of polyphenylsilsesquioxane, and may be applied to any types of films containing organic groups.

Alternatively, it was possible to provide the same effect by using plasma of another inactive gas such as argon or neon, or using plasma of an oxygen gas.

As set forth above, even when polyphenylsilsesquioxane exhibiting excellent heat resistance was used as the interlayer flattening film, irrespective of the carbon content, it was possible to modify a surface of the silicone series resin film so as to form an oxide film, thereby enabling the use of a gas containing no oxygen.

According to the present invention, it is possible to provide the through-hole in the typical process.

As is clear from the above description, according to the present invention, the silicone ladder polymer is used as the flattening film for the interlayer insulating layer interposed between the wiring layers. Therefore, the film can exhibit good resistance to crack, and can be applied to form a thick film. Further, only one coating of the film can provide excellent flatness, resulting in a simplified process.

In addition, the film discharges a small amount of gas, and can exhibit a good bond performance to other layers. As a result, it is possible to provide a semiconductor device with the Al wiring having long-term reliability.

Further, it is possible to provide an etching rate according to a process by controlling the carbon content of the film. It is also possible to successfully provide the contact hole even when the interlayer insulating layer is formed by the combination of the inorganic silicon oxide film and the silicone ladder polymer.

A surface of the flattening film made of the silicone ladder polymer is modified to provide the inorganic film by the decarbonization processing such as surface treatment by the plasma of the inactive gas. It is thereby possible to etch the flattening film by the gas containing no oxygen.

As a result, it is possible to provide the same etching selection ratio of the film and other layers, or provide the largely different selection ratio of the film and the resist mask used at the time to form a pattern by the etching.

While preferred embodiments of the invention have been described using specific terms, such description is for illustrative purposes only, and it is to be understood that changes and variations may be made without departing from the spirit or scope of the following claims.

What is claimed is:

1. A semiconductor device comprising:
   a first wiring layer on which a given wiring pattern is formed;
   an interlayer insulating layer formed on the first wiring layer so as to have a contact hole and absorb irregularity due to the first wiring layer; and
   a second wiring layer formed by providing a given pattern on the interlayer insulating layer:
   said second wiring layer and said first wiring layer being connected through the contact hole provided in the interlayer film at a predetermined position;
   wherein the interlayer insulating layer has a flattening film component which is a cured resin film made of a resin material containing one or more silicone ladder polymers of which 20 to 60% by wt. is hydrogen silsesquioxane, so as to adjust the carbon atom content of said flattening film for setting an etching rate on production to a predetermined extent, the silicone ladder polymers having the formula:

$$(HO)_2(R_2Si_2O_3)_nH_2$$

wherein n denotes an integer which defines the weight average molecular weight of the silicone ladder polymer to within the range of 2,000 to 100,000; and R represents one or more of a hydrogen atom, lower alkyl or phenyl.

2. A semiconductor device according to claim 1, wherein the flattening film contains a silicone polymer containing hydroxy groups in side chains.

3. A semiconductor device according to claim 2, wherein the silicone polymer is contained in the resin material in the range of 5 to 30 weight percent.

4. A semiconductor device according to claim 1, wherein the resin material contains a silane coupling agent in the range of 150 to 100,000 ppm.

5. A semiconductor device according to claim 4, wherein the resin material contains a silane coupling agent in the range of 3,000 to 100,000 ppm.

6. The semiconductor device according to claim 1, wherein the "OH" group is absent from the side chains of said silicone ladder copolymer.

7. The semiconductor device according to claim 1, wherein said silicone ladder polymer is a mixture of silicone ladder polymers one of which has a weight average molecular weight of at least 30,000, and the other silicone ladder polymer has a weight average molecular weight less than 30,000.

8. The semiconductor device according to claim 7, wherein the amount of the low molecular weight silicone ladder polymer is at least 20 wt % with respect to the high molecular weight silicone ladder polymer.

\* \* \* \* \*